United States Patent
Kotsubo et al.

(10) Patent No.: US 7,931,518 B2
(45) Date of Patent: Apr. 26, 2011

(54) PROCESS FOR PREPARING LIGHT TRANSMISSIVE ELECTROMAGNETIC WAVE SHIELDING MATERIAL, LIGHT TRANSMISSIVE ELECTROMAGNETIC WAVE SHIELDING MATERIAL AND DISPLAY FILTER

(75) Inventors: Hidefumi Kotsubo, Kodaira (JP); Tatsuya Funaki, Kodaira (JP); Kiyomi Sasaki, Kodaira (JP)

(73) Assignee: Bridgestone Corporation, Tokyo (JP)

( * ) Notice: Subject to any disclaimer, the term of this patent is extended or adjusted under 35 U.S.C. 154(b) by 91 days.

(21) Appl. No.: 12/376,033

(22) PCT Filed: Aug. 3, 2007

(86) PCT No.: PCT/JP2007/065275
§ 371 (c)(1),
(2), (4) Date: Feb. 13, 2009

(87) PCT Pub. No.: WO2008/016142
PCT Pub. Date: Feb. 7, 2008

(65) Prior Publication Data
US 2010/0003474 A1    Jan. 7, 2010

(30) Foreign Application Priority Data
Aug. 3, 2006 (JP) ................................. 2006-212142
Aug. 3, 2006 (JP) ................................. 2006-212154

(51) Int. Cl.
*H01J 9/12* (2006.01)
(52) U.S. Cl. ............ 445/49; 445/52; 428/209; 428/344; 428/349; 174/350; 174/357; 427/531; 427/532; 427/545
(58) Field of Classification Search .................. 174/350, 174/357; 428/209, 344, 349; 427/531, 532, 427/545; 445/49, 52
See application file for complete search history.

(56) References Cited

U.S. PATENT DOCUMENTS

| | | | | |
|---|---|---|---|---|
| 5,932,339 A | * | 8/1999 | Sakurai et al. | 428/323 |
| 6,086,979 A | * | 7/2000 | Kanbara et al. | 428/209 |
| 6,194,492 B1 | * | 2/2001 | Sakurai et al. | 523/515 |
| 6,882,091 B2 | * | 4/2005 | Kotsubo et al. | 313/112 |
| 7,214,282 B2 | * | 5/2007 | Yoshikawa et al. | 156/60 |
| 7,244,159 B2 | * | 7/2007 | Kotsubo | 445/49 |
| 7,611,746 B2 | * | 11/2009 | Funaki et al. | 427/96.3 |

OTHER PUBLICATIONS

JP 2000-196285, published Jul. 14, 2000 with Patent Abstracts of Japan.
JP 2000-196286, published Jul. 14, 2000 with Patent Abstracts of Japan.
JP 2000-286595, published Oct. 13, 2000 with Patent Abstracts of Japan.
JP 2001-177290, published Jun. 29, 2001 with Patent Abstracts of Japan.

(Continued)

*Primary Examiner* — Cathy Lam
(74) *Attorney, Agent, or Firm* — Sughrue Mion, PLLC

(57) ABSTRACT

The present invention provides a process for preparing a light transmissive electromagnetic wave shielding material having an excellent light transmissive property, an excellent electromagnetic wave shielding property, an excellent appearance property and an excellent legibility by a simple method.
A process for the preparation of a light transmissive electromagnetic wave shielding material comprising;
(A1) printing a pretreatment agent for electroless plating comprising a noble metal compound and a mixture of silane coupling agent and azole compound or a reaction product thereof in a mesh pattern on a transparent substrate 11 to form a mesh-patterned pretreatment layer 12, and
(A2) subjecting the pretreatment layer 12 to electroless plating to form a mesh-patterned metal conductive layer 13 on the pretreatment layer 12.

26 Claims, 1 Drawing Sheet

OTHER PUBLICATIONS

JP 2001-102792, published Apr. 13, 2001 with Patent Abstracts of Japan.
JP 2002-055624, published Feb. 20, 2002 with Patent Abstracts of Japan.
JP 11-170420, published Jun. 29, 1999 with Patent Abstracts of Japan.
JP 2003-304090 A, published Oct. 24, 2003 with Patent Abstracts of Japan.
WO 2004/024984 A1, published Mar. 25, 2004 with Abstract.
WO 2004/039138 A1, published May 6, 2004 with Abstract.
JP 2004-277688 A, published Oct. 7, 2004 with Patent Abstracts of Japan.

* cited by examiner

PROCESS FOR PREPARING LIGHT TRANSMISSIVE ELECTROMAGNETIC WAVE SHIELDING MATERIAL, LIGHT TRANSMISSIVE ELECTROMAGNETIC WAVE SHIELDING MATERIAL AND DISPLAY FILTER

BACKGROUND OF INVENTION

1. Field of the Invention

The present invention relates to a process for preparing a light transmissive electromagnetic wave shielding material which is useful in an adhesive sheet used for a front filter of a plasma display panel (PDP) or windows of a building such as a hospital requiring electromagnetic wave shielding. In addition, the invention relates to an electromagnetic wave shielding material prepared by the above process and a display panel provided with the material.

2. Description of the Related Art

In recent years, along with the popularization of office automation equipments and communication equipments, there is fear that an electromagnetic wave generated by the equipments has an affect on the human body. In addition, the electromagnetic wave generated by a cell-phone may cause a precision equipment to malfunction. Therefore, the occurrence of the electromagnetic wave is of a problem to be solved.

For the reason, a light transmissive electromagnetic wave shielding material having a light transmissive property and an electromagnetic wave shielding property have been developed as a front filter of a plasma display panel and are put to practical use. Also the light transmissive electromagnetic wave shielding material is used as a window filter of a hospital and a laboratory where the precision equipment is installed in order to protect the precision equipment from the electromagnetic wave.

The light transmissive electromagnetic wave shielding material is required to balance the light transmissive property with the electromagnetic wave shielding property. Therefore, as the light transmissive electromagnetic wave shielding material, for example (1) a conductive layer having a fine mesh structure which is obtained by netting a metal wire or a conductive fabric is adopted. The mesh part of the conductive layer shields the electromagnetic wave and its opening part ensures the light transmissive property.

In addition, a variety of the light transmissive electromagnetic wave shielding materials is proposed as a filter for a electronic display. Other examples of the light transmissive electromagnetic wave shielding materials generally include (2) a transparent substrate on which a transparent conductive layer comprising metallic silver is formed, (3) a transparent substrate on which a copper layer having a mesh pattern is formed by etching, and (4) a transparent substrate on which a conductive ink comprising conductive powders is printed in the mesh pattern.

In order to balance the light transmissive property with the electromagnetic wave shielding property in the electromagnetic wave shielding layer, it is necessary to use the transparent conductive layer having a microscopic mesh pattern and an extremely narrow line width. However, it was difficult for the conventional light transmissive electromagnetic wave shielding material to balance the light transmissive property with the electromagnetic wave shielding property. This is, it is difficult for the light transmissive electromagnetic wave shielding material (1) to have the microscopic mesh pattern due to limitation for minimizing the line and distortion of line arrangement. The light transmissive electromagnetic wave shielding material (2) has problems that the electromagnetic wave shielding property is not enough and the metallic luster is too high. The light transmissive electromagnetic wave shielding material (3) has problems that the production process is long, the cost is high, and the light transmissive property is reduced by an adhesive layer arranged between the transparent substrate and the copper layer. In addition, the light transmissive electromagnetic wave shielding material (4) has problems that the electromagnetic wave shielding property is low. If the electromagnetic wave shielding property of the material (4) is increased by thickening the conductive ink layer, the light transmissive property may be reduced.

However, the light transmissive electromagnetic wave shielding material (4) is prepared by printing the conductive ink comprising a resin and a conductive powder such as metallic powder and carbon powder on the transparent substrate by offset printing using engraved plate to provide a printed pattern. Therefore, the process for preparing the light transmissive electromagnetic wave shielding material (4) does not need etching, and is easy and low in cost.

Documents 1 to 6 disclose a process for preparing a light transmissive electromagnetic wave shielding material, wherein the (4) is improved, which comprise;

printing the conductive ink on the transparent substrate in a specific pattern by offset printing using engraved plate to provide a printed pattern layer, and forming a metallic layer on the printed pattern layer by electroless plating or electrolytic plating to enhancing the electromagnetic wave shielding property.

In addition, Document 7 discloses a process for preparing a light transmissive electromagnetic wave shielding material which comprise;

printing a paste comprising particles (supports) having a surface charge opposite to a noble-metal ultrafine particle catalyst and the precious-metals ultrafine particle catalyst formed on the particles in a specific pattern on a transparent substrate, and, forming a metallic layer on the printed part by electroless plating.

Document 1: JP3017987-B
Document 2: JP3017988-B
Document 3: JP3241348-B
Document 4: JP3425400-B
Document 5: JP3544498-B
Document 6: JP3532146-B
Document 7: JP3363083-B

SUMMARY OF THE INVENTION

Problem to be Solved by the Invention

However, the processes of Documents 1-7 have a difficulty in printing the conductive ink or the paste with a high dimensional accuracy to form the microscopic pattern. Therefore, the processes have room for improvement in the balance of the light transmissive property with the electromagnetic wave shielding property. In addition, the light transmissive electromagnetic wave shielding material obtained by the processes decreases not only an appearance property and but also a visual property of an electron display due to a crack and a fog generated in the printing of the conductive ink or the paste.

Accordingly, the objection of the present invention is to provide a process for preparing a light transmissive electromagnetic wave shielding material having an excellent light transmissive property, an excellent electromagnetic wave shielding property, an excellent appearance property, an excellent legibility and a high accuracy-microscopic mesh pattern by a simple method.

Means for Solving Problem

It is thought that the above problem is caused by the presence of conductive powders and supports having the noble-metals ultra fine particle catalyst thereon, which are contained in the conductive ink or the paste. These conductive powders and supports must be fine in order to form a layer having a low contact resistance and a uniform thickness. However, the powders having a small particle size easily agglutinate. The above problem therefore may be caused by the agglutination of the conductive powders and the supports.

The present inventors have eagerly studied in view of the aforementioned problems, and consequently found out that the problems can be resolved by using a pretreatment agent for electroless plating comprising a noble metal compound and a mixture of a silane coupling agent and an azole compound or a reaction product thereof instead of the conventional conductive ink and paste to prepare a light transmissive electromagnetic wave shielding material.

Therefore, the above object is attained by the present invention, i.e., a process for the preparation of a light transmissive electromagnetic wave shielding material comprising;

printing a pretreatment agent for electroless plating comprising a noble metal compound and a mixture of a silane coupling agent and an azole compound or a reaction product thereof in a mesh pattern on a transparent substrate to form a mesh-patterned pretreatment layer, and subjecting the pretreatment layer to electroless plating to form a mesh-patterned metal conductive layer on the pretreatment layer.

EFFECT OF THE INVENTION

The metal conductive layer having a microscopic pattern and a uniform thickness can be formed with a high dimensional accuracy by using the pretreatment agent for electroless plating of the invention comprising a noble metal compound, a silane coupling agent and an azole compound to form the pretreatment layer, and forming the metal conductive layer on the pretreatment layer. In addition, the noble metal compound, the silane coupling agent and the azole compound are dispersed at the atomic level, so that the pretreatment layer having no a crack and a fog is formed. The pretreatment agent for electroless plating preferably further comprises a synthetic resin. This pretreatment agent can form the pretreatment layer having a high adhesion to the transparent substrate and the metal conductive layer. In addition, the pretreatment layer having the high adhesion enables the formation of the metal conductive layer with a high dimensional accuracy.

Therefore, the process of the present invention provides a light transmissive electromagnetic wave shielding material having an excellent light transmissive property, an excellent electromagnetic wave shielding property, an excellent appearance property and an excellent visibility.

DESCRIPTION OF THE REFERENCE NUMBERS

11: transparent substrate
12, 22: mesh-shaped pretreatment layer
13: mesh-shaped metal conductive layer
14: blackening treatment layer
15: opening part

DETAILED DESCRIPTION OF THE INVENTION

Figure 1:
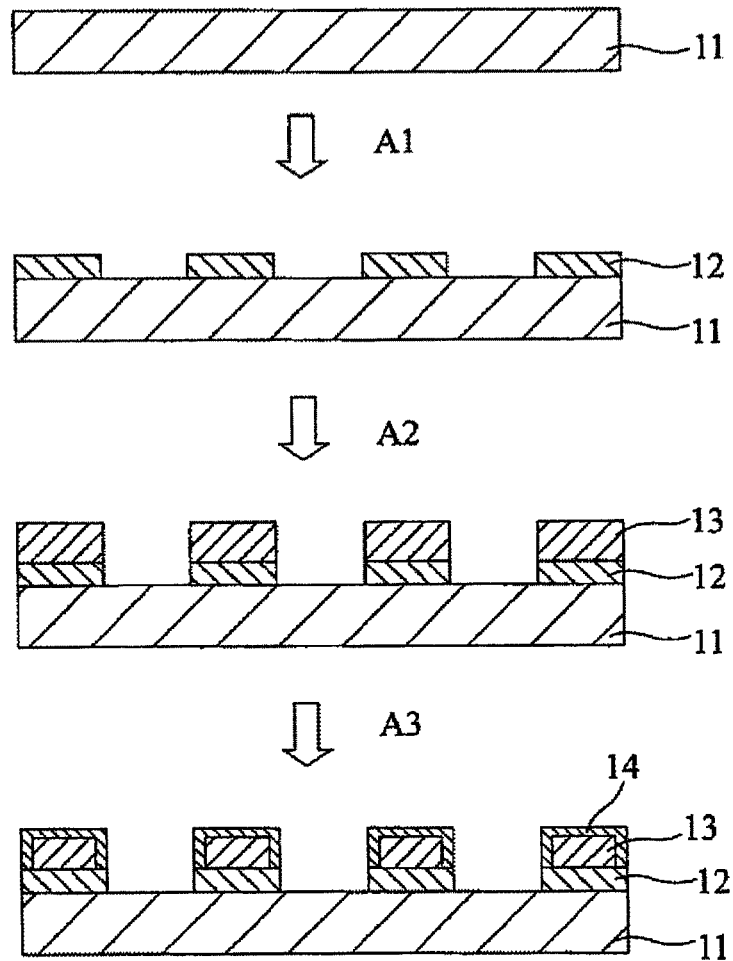
FIG. 1 is a view for explaining the process for preparing the light transmissive electromagnetic wave shielding material according to the present invention using cross-section views of each step.

FIG. 1 shows each of the steps of the process of the present invention.

In the present invention, firstly, a pretreatment agent for electroless plating comprising a noble metal compound and a mixture of a silane coupling agent and an azole compound or the reaction product thereof is printed in a mesh pattern on a transparent substrate 11 to form a mesh-shaped pretreatment layer 12 (an arrow A1 of FIG. 1).

The silane coupling agent, the azole compound and the noble metal compound can be dispersed at the atomic level in the pretreatment layer. In addition, the pretreatment agent for electroless plating does not comprise a metallic powder and a conductive powder used in a conventional method. Therefore, the pretreatment agent forms the mesh-shaped pretreatment layer having no a crack and a fog with a high dimensional accuracy. The pretreatment layer has a high adhesion to the transparent substrate and the metallic conductive layer by using the silane coupling agent and the azole compound. In addition, the noble metal compound is effective in deposition of the metal in the electroless plating. Therefore, the mesh-shaped metal conductive layer having a sufficient thickness can be formed selectively on the mesh-shaped pretreatment layer by the electroless plating.

In the present invention, the metal conductive layer 13 is then formed on the mesh-shaped pretreatment layer 12 by electroless plating (an arrow A2 of FIG. 1).

The fine metallic particles are deposited continuously at high concentrations on the pretreatment layer by the above step to form the substantially continuous metal conductive layer bonded firmly to the pretreatment layer and having a microscopic pattern.

As described above, the metal conductive layer having the microscopic pattern of the present invention can be formed by the simple method, so that the light transmissive electromagnetic wave shielding material have an excellent light transmissive property and an excellent electromagnetic wave shielding property. In addition, the pretreatment agent for electroless plating comprising no a powdery particle forms the pretreatment layer without the formation of the crack and the fog, so that the light transmissive electromagnetic wave shielding material having an excellent appearance property and an excellent visual property is provided.

The process for preparing the light transmissive electromagnetic wave shielding material according to the present invention is explained in detail below.

Firstly, the pretreatment agent comprising a noble metal compound and a mixture of a silane coupling agent and an azole compound or a reaction product thereof is printed in the mesh pattern on the transparent substrate to form a mesh-shaped pretreatment layer on the transparent substrate.

The silane coupling agent used in the pretreatment agent preferably has a group having a metal capture ability. Such the silane coupling agent is capable of converting the electron state and arrangement of the noble metal compound used as the electroless plating catalyst to those showing an increased catalytic activity and firmly bonding to the transparent substrate.

As the silane coupling agent, an epoxy group-containing silane compound can be used. Examples of the epoxy group-containing silane compounds include, for example γ-glycidoxypropyltrialkoxysilane, 3-glycidoxypropyltrimethoxysilane, 3-glycidoxypropylmethyl dimethoxysilane, 3-glycidoxypropyltriethoxysilane, 3-glycidoxypropylmethyldiethoxysilane and 2-(3,4-epoxycyclohexyl)ethyltrimethoxysilane. These can be each used singly, or in combination of two more kinds. The γ-glycidoxypropyltrialkoxysilane is particularly preferred, because it brings about the pretreatment layer having an excellent adhesion to the transparent substrate and the metal conductive layer.

Examples of the azole compounds used in the pretreatment agent for electroless plating include imidazole, oxazole, thiazole, selenazole, pyrazole, isooxazole, isothiazole, triazole, oxadiazole, thiadiazole, tetrazole, oxatriazole, thiatriazole, bendazole, indoazole, benzimidazole, benzotriazole and indazole. The imidazole is particularly preferred, because it has a high reactivity to the groups (e.g., epoxy group) of the silane coupling agent and the noble metal compound.

Although the pretreatment agent for electroless plating may be prepared by simply mixing the silane coupling agent and the azole compound, these may be reacted preliminarily with each other to form the reaction product thereof. The reaction product disperses the noble metal compound in the pretreatment layer at the atomic level, whereby the light transmissive property of the obtained pretreatment layer can be improved.

In the reaction of the silane coupling agent with the azole compound, the silane coupling agent preferably is used in an amount of 0.1 to 10 mole per a mole of the azole compound at a temperature of 80 to 200° C. with a reaction time of 5 minutes to 2 hours. Although the solvent is generally unnecessary in the reaction, solvent water, organic solvents such as chloroform, dioxane-methanol and ethanol can be used. The pretreatment agent can be obtained by adding the noble metal compound to the obtained reaction product of the silane coupling agent and the azole compound.

The noble metal compound which can be used in the pretreatment agent is capable of selectivity precipitating the metal (for example copper and aluminum) from the plating solution and growing it. The noble metal compounds containing palladium, silver, platinum and gold are preferable, because they show a high catalytic activity. Examples of the compounds include chloride, hydroxide, oxide, hydrosulfate and ammine complex such as ammonium salt of the above metals. The palladium compound, in particularly the palladium choloride is preferred.

The pretreatment agent for electroless plating preferably contains the noble metal compound in the amount of 0.001 to 50 mol %, more preferably 0.1 to 20 mol % based on the azole compound and silane coupling agent. When the amount of the noble metal compound is less than 0.001 mol %, the catalyst activity is apt not to be high enough to form the metal conductive layer having thick sufficiently. When the amount of the noble metal compound is more than 50 mol %, the catalyst activity of the noble metal compound is not apt to be increased with the increase of the additive amount.

The pretreatment agent for electroless plating preferably further comprises a synthetic resin. The pretreatment layer containing the synthetic resin adheres firmly to the transparent substrate and the metal conductive layer. The detachment of the pretreatment layer therefore is prevented, so that the metal conductive layer is formed with a high dimensional accuracy.

There is no particular limitation on the synthetic resin used in the pretreatment agent, provided that the synthetic resin can enhance the adhesion to the transparent substrate and the metal conductive layer. Examples of the synthetic resins include acrylic resins, polyester resins, polyurethane resins, vinyl chloride resins and ethylene-vinyl acetate copolymers. These synthetic resins have an excellent adhesion to the transparent substrate and the metal conductive layer, and enables the formation of the metal conductive layer on the pretreatment layer with a high dimensional accuracy. These synthetic resins can be each used singly, or in combination of two more kinds.

As the acrylic resin, homopolymer or copolymer of, for example alkyl acrylate ester such as methyl acrylate, ethyl acrylate, butyl acrylate and hexyl acrylate; alkyl methacrylate esters such as methyl methacrylate, ethyl methacrylate, butyl methacrylate and hexyl methacrylate can be used. Polymethylmethacrylate, polyethylmethacrylate and polybutylmethacrylate are preferred.

Examples of the polyester resins include polyethylene terephthalate, polybuthylene terephthalate, polytrimethylene terephthalate and 2,6-polyethylene naphthalate.

Examples of the polyurethane resins include polyester urethane resin, polyether urethane resin and polycarbonate urethane resin. Among of them, the polyester urethane resin is preferred.

Examples of the polyester urethane resins include a reaction products of polyether polyol with polyisocyanate. The average molecular weight of the polyester urethane resins are generally in the range of 10,000 to 500,000.

Examples of the polyester polyols include condensed polyester diols obtained by reacting a low-molecular-weight diol with a dicarboxylic acid, polylactone diols obtained by ring-opening polymerization of a lactone and a polycarbonate diol. Examples of the low-molecular-weight diols include diols such as ethylene glycol, diethylene glycol, triethylene glycol, propylene glycol and buthylene glycol; triols such as trimethylolpropane, trimethylolethane, hexanetriol and glycerin; hexaols such as sorbitol. Examples of the dicarboxylic acids include an aliphatic dicarboxylic acids such as succinic acid, adipic acid, sebacic acid, glutaric acid, azelaic acid, maleic acid and fumaric acid; an aromatic dicarboxylic acids such as terephthalic acid and isophthalic acid. These can be each used singly, or in combination of two more kinds. In addition, examples of the lactone include caprolactone.

Examples of the polyester polyols include polyethylene adipate, polybutylene adipate, polyhexamethylene adipate, polyneopentyl adipate, polyethylene-butylene adipate, polybutylene-hexabutylene adipate, polydiethylene adipate, poly (tetramethylene ether) adipate, polyethylene azeto, polyethylene sebacate, polybutylene azeto, polybutylene sebacate and polyhexamethylene carbonate diol. These can be each used singly, or in combination of two more kinds.

Examples of the polyisocyanate compounds include aromatic diisocyanates (for example 4,4'-diphenylmethane diisocyanate, 2,4-tolylene diisocyanate, 1,5-naphthalene diisocyanate, n-isocyanate phenyl sulfonyl isocyanate and m- or p-isocyanate phenyl sulfonyl isocyanate); aliphatic diisocyanates (for example 1,6-hexamethylene diisocyanate); cycloaliphatic diisocyanates (for example isophorone diisocyanate, hydrogenated xylylene diisocyanate and hydrogenated diphenylmethane diisocyanate); and adducts and polymer of these isocyanate. These can be each used singly, or in combination of two more kinds.

Although there is no limitation on the ratio of the polyisocyanate compound to the polyester polyol, the molar ratio (the polyester polyol: the polyisocyanate compound) can be determined within the range of 1:0.01 to 0.5 depending on the used compounds.

In case the polyester polyurethane resin is used, the pretreatment agent preferably comprises further a polyisocyanate cure agent. The same compounds as the above-mentioned polyisocyanate compounds can be used as the polyisocyanate cure agent. The amount of the cure agent preferably is in the range of from 0.1 to 5 parts by weight, more preferably from 0.1 to 1.0 parts by weight based on 100 parts by weight of the polyester polyurethane resin.

The vinyl chloride resins generally are conventional homopolymers and copolymers of vinyl chloride. Examples of the copolymers include copolymers of vinyl chloride and vinylester such as vinyl chloride-vinyl acetate copolymer and vinyl chloride-vinyl propionate copolymer, copolymers of vinyl chloride and acrylic ester such as vinyl chloride-butyl acrylate copolymer and vinyl chloride-2-ethylhexyl acrylate copolymer, copolymer of vinyl chloride and olefin such as vinyl chloride-ethylene copolymer and vinyl chloride-propylene copolymer, and vinyl chloride-acrylonitrile copolymer. Homopolymer of vinyl chloride, vinyl chloride-ethylene copolymer and vinyl chloride-vinyl acetate copolymer are particularly preferred.

The synthetic resin having a functional group which has an active hydrogen at the terminal position is preferred, because it enhances the adhesion. Examples of the functional groups having an active hydrogen include a primary amino group, a secondary amino group, an imino group, an amido group, a hydrazide group, an amidino group, a hydroxyl group, a hydroperoxy group, a carboxyl group, a formyl group, a carbamoyl group, a sulfonate group, a sulfinic acid group, a sulfenic acid group, a thiol group, a thioformyl group, a pyrrolyl group, an imidazolyl group, a piperidyl group, an indazpolyl group and a carbazolyl group. Preferred are the primary amino group, the secondary amino group, the imino group, the amido group, the imido group, the hydroxyl group, the formyl group, the carbamoyl group, the sulfonate group and the thiol group. The primary amino group, the secondary amino group, the amido group and the hydroxyl group are particularly preferred. These groups may be substituted by a halogen atom or a hydrocarbon group having 1 to 20 carbon atoms. Of them, hydroxyl group, carbonyl group and amino group are preferred.

The amount of the synthetic resin in the pretreatment agent preferably is in the range of from 1 to 50% by weight, more preferably from 5 to 20% by weight based on the total amount of the pretreatment agent. When the amount is in the range, the pretreatment layer shows an excellent adhesion.

The pretreatment agent for electroless plating may comprise an inorganic fine particle. The pretreatment agent comprising the inorganic fine particle enhances the print precision, so that the metal conductive layer is formed with a high dimensional accuracy. Examples of the inorganic fine particles include silica particle, calcium carbonate particle, carbon particle, alumina particle, talc particle, mica particle, glass flake, metallic whisker, ceramic whisker, calcium sulfate whisker and smectite. These can be each used singly, or in combination of two more kinds.

The average particle diameter of the inorganic fine particle preferably is in the range of from 0.01 to 5 µm, more preferably from 0.1 to 3 µm. If the average particle diameter of the inorganic fine particle is less than 0.01 µm, the print precision is not apt to be enhanced sufficiently. If the average particle diameter of the inorganic fine particle is excess 5 µm, a crack and a fog are apt to be formed.

The amount of the inorganic fine particle in the pretreatment agent for electroless plating preferably in the range of from 0.01 to 10 parts by weight, in particularly from 1 to 5 parts by weight based on 100 parts by weight of the synthetic resin. If the amount is in the range, the print performance of the pretreatment agent is improved.

The pretreatment agent for electroless plating may further comprise a thixotropic agent. The thixotropic agent is capable of controlling the flowability of the pretreatment agent and enhancing the print precision, so that the metal conductive layer is formed with a high dimensional accuracy. The conventional thixotropic agent can be used. The preferred examples of the thixotropic agents include amide wax, cured castor-oil, bees wax, carnauba wax, stearic acid amide and hydroxystearic acid ethylene bis-amid.

The amount of the thixotropic agent in the pretreatment agent preferably is in the range of from 0.1 to 10 parts by weight, in particularly from 1 to 5 parts by weight based on 100 parts by weight of the synthetic resin. If the amount is in the range, the print performance of the pretreatment agent is improved.

The pretreatment agent of the present invention may comprise a black coloring agent. The black coloring agent generally improves the print performance of the pretreatment agent, and provides the transparent substrate side of the light transmissive electromagnetic wave shielding material with an anti-glare property.

Examples of the black coloring agents include carbon black, titan black, black iron oxide, black lead and activated carbon. These can be each used singly, or in combination of two more kinds. Of them, carbon black is preferred. Examples of the carbon blacks include acetylene black, channel black and furnace black. The average particle diameter of the carbon black preferably is in the range of from 0.1 to 1000 nm, more preferably from 5 to 500 nm.

The amount of the black coloring agent in the pretreatment agent preferably is in the range of from 0.1 to 10 parts by weight, in particularly from 1 to 5 parts by weight based on 100 parts by weight of the synthetic resin. If the amount is in the range, the print performance of the pretreatment agent is improved.

The pretreatment agent comprising the black coloring agent preferably can be prepared by using a commercially available black ink. Examples of the commercially available black inks include SS8911 available from TOYO INK MFG. CO., LTD., EXG-3590 available from JUJO CHEMICAL CO., LTD., and NT HiLamic 795R black available from Dainichiseika Color & Chemicals Mfg. Co., Ltd. For example, the black ink (SS8911 from TOYO INK MFG. CO., LTD.) comprises vinyl chloride and acrylic resin in addition to carbon black in solvent. Use of this black ink therefore enables the easy preparation of the pretreatment agent for electroless plating comprising the synthetic resin and the black coloring agent.

In addition, the pretreatment agent for electroless plating may comprise a suitable solvent. Examples of the solvents include water, methanol, ethanol, 2-propanol, acetone, toluene, ethylene glycol, dimethylformamide, dimethylsulfoxide and dioxane. These can be each used singly, or in combination of two more kinds.

If necessary, the pretreatment agent for electroless plating may further comprise additives such as extender pigment, surface active surfactant and colorant.

In the present invention, there is no particular limitation on the transparent substrate, provided that the transparent substrate has a transparence and flexibility and can withstand the subsequent steps. Examples of materials of the transparent substrates include glass, polyester (for example, polyethylene terephthalate (PET), polybutylene terephthalate), acrylic resin (for example, polymethylmethacrylate (PMMA)), polycarbonate (PC), polystyrene, cellulose triacetate, polyvinylalcohol, polyvinyl chloride, polyvinylidene chloride, polyethylene, ethylene-vinyl acetate copolymer, polyvinyl butyral, metal ion crosslinked ethylene-methacrylic acid copolymer, polyurethane and cellophane. Of them, PET, PC and PMMA are preferred, because these are less deteriorated by the processing treatments (heating, solvent and bending) and have an excellent transparency. The sheet, film and plate composed of the above materials can be used as the transparent substrate.

There is no limit of the thickness of the transparent substrate. However, the transparent substrate is preferably thin from a viewpoint of the light transmissive property of the light transmissive electromagnetic wave shielding material. The thickness of the transparent substrate can be determined within the range of 0.05 to 5 mm depending on the configuration at the application and the needed mechanical strength.

In the present invention, the above pretreatment agent for electroless plating is printed in the form of the mesh pattern on the transparent substrate to provide the pretreatment layer having the mesh pattern on the transparent substrate. The pretreatment layer can easily form the metal conductive layer having the microscopic pattern.

The viscosity of the pretreatment agent for electroless plating preferably is in the range of from 500 to 5000 cps, more preferably from 1000 to 3000 cps at 25° C. in order to form the pretreatment layer having a microscopic line width and a microscopic gap (pitch).

The pretreatment agent can be printed on the transparent substrate by printing methods such as a gravure printing, a screen printing, an offset lithography, an ink jet printing, an electrostatic printing and a flexo printing. From the viewpoint of formation of a thin line, the gravure printing is preferred. When the gravure printing is used, the printing speed is preferably in the range of 5 to 50 m/minute.

On the other hand, the pretreatment layer may be formed by transferring printing. If the transferring printing is used, the pretreatment layer can be formed on the transparent substrate by printing the pretreatment agent on an another substrate sheet for transferring printing which is different from the transparent substrate by using the same printing method as above, and then combining the substrate sheet with the transparent substrate by heat laminating, dry laminating, wet laminating or extrusion laminating, and then separating only the substrate sheet.

The pretreatment agent after the printing preferably is dried by heating it at a temperature of 80 to 160° C., more preferably 90 to 130° C. If the temperature of the drying is less than 80° C., the evaporation rate of the solvent may be low and the film-forming ability may be decreased. If the temperature of the drying is more than 160° C., the compound may be decomposed. The drying time after the printing preferably is in the range of 5 seconds to 5 minutes.

The figure of the pattern of the mesh-shaped preatment layer is selected arbitrarily from a grid pattern having square openings (pores) and a punching metal pattern having circle, hexagone, triangle or ellipse openings (pores). The pores may be regularly or randomly arranged.

Figure 2:
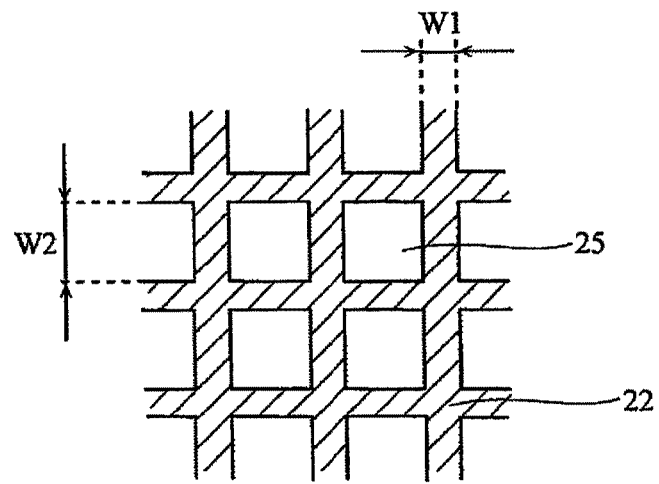
FIG. 2 is a view showing a frame pattern of the pretreatment layer.

In order to provide the high light transmissive property and the high electromagnetic wave shielding property to the metal conductive layer, the pretreatment layer is arranged preferably at regular intervals. In addition, from the purpose of the forming the metal conductive layer having high light transmissive property, the figure of the openings of the metal conductive layer preferably is tetragon, in particular regular tetragon to increase the aperture ratio. The pretreatment layer therefore preferably has microscopic opening parts. For example, FIG. 2 is a view showing a frame format of the pretreatment layer 22 having the regular tetragonal openings 25.

The pretreatment layer preferably has the line width ($W_1$) of from 1 to 50 μm and the aperture ratio of from 50 to 95%, in particularly the line width ($W_1$) of from 5 to 40 μm and the aperture ratio of from 60 to 95%. The aperture ratio of the pretreatment layer mans the proportion of the area of all the openings of the layer to the projected area of the layer. The line pitch ($W_2$) preferably is in the range of from 50 to 1000 μm, more preferably from 100 to 400 μm. The present invention brings about the pretreatment layer having microscopic pattern with a high dimensional accuracy as described above.

The mesh-shaped pretreatment layer may be formed on the central portion of the transparent substrate, and the frame-shaped pretreatment layer may be formed on the surrounding portion of the transparent substrate other than the central portion. If the metal conductive layer is formed on the pretreatment layer having the above structures, the mesh-pattern part of the metal conductive layer can be protected by the frame-shaped part of the metal conductive layer.

The thickness of the pretreatment layer preferably is in the range of from 0.01 to 5 μm, more preferably from 0.05 to 2 μm, in particularly from 0.05 to 0.5 μm. If the thickness of the pretreatment layer is in the range, the pretreatment layer adheres firmly to the transparent substrate and the metal conductive layer.

In the present invention, the pretreatment layer is subjected to electroless plating to form the mesh-shaped metal conductive layer on the pretreatment layer. The fine metallic particles are deposited continuously at high concentrations on the pretreatment layer by the electroless plating to form a continuous metal conductive layer, which is formed selectively on the only pretreatment layer in the mesh pattern having a sufficient thickness.

There is no particular limitation on metal for plating, provided that the metal for plating has a conductive property and a platable property. The metal for plating may be a metal element, an alloy, a conductive metal oxide, a metallic thin film, or fine particles coated uniformly.

Examples of the metals used for the electroless plating include aluminum, nickel, indium, chrome, gold, vanadium, tin, cadmium, silver, platinum, copper, titanium, cobalt and lead. In particular, silver, copper and aluminum are preferred, because these metals can form the metal conductive layer having a high electromagnetic wave shielding property. The metal conductive layer formed by using the above metal has a high adhesive property to the pretreatment layer, a high light transmissive property and a high electromagnetic wave shielding property.

The electroless plating can be carried out by a known method using a electroless plating bath, for example, by immersing materials for plating in the electroless plating bath comprising a plating metallic salt, a chelating agent, a pH adjuster and a reducing agent as basic constituents, or by separating a plating solution into two or more parts and adding them.

In case of the formation of the metal conductive layer comprising copper are formed, the transparent substrate on which the pretreatment layer are formed is immersed in a solution comprising an aqueous copper salt such as copper sulfate in an amount of 1 to 100 g/L, in particularly 5 to 50 g/L, a reduction agent such as formaldehyde in an amount of 0.5 to 10 g/L, in particular 1 to 5 g/L and a complexing agent such as EDTA in an amount of 20 to 100 g/L, in particularly 30 to 70 g/L, and having a pH in the range of 12 to 13.5, in particularly 12.5 to 13 at temperature of 50 to 90° C. for 30 seconds to 60 minutes.

In the electroless plating, the substrate to be plated can be vibrated and rotated. In addition, air agitation may be carried out on the area around the substrate.

In the present invention, the pretreatment layer formed on the transparent substrate may be subjected to electrolytic plating after the electroless plating so as to provide the metal conductive layer having desired thickness and line width.

As the metals used in the electrolytic plating, the same metals as the above-mentioned metals for electroless plating can be used.

The electrolytic plating can be carried out by a known method, for example, by immersing the transparent substrate having the pretreatment layer and the metal conductive layer in a plating solution, passing an electric current through the plating solution. In the electrolytic plating, the transparent substrate is used as a cathode, and the plating metal is used as an anode. The composition of the plating solution is practically not limited. For example, in case the metal conductive layer composed of copper is formed, an aqueous solution of copper sulfate can be used.

The figure of the mesh-shaped metal conductive layer is the same as the above-mentioned figure of the pretreatment layer.

The metal conductive layer preferably has the line width ($W_1$) of from 1 to 50 μm and the aperture ratio of from 50 to 95%, in particularly the line width ($W_1$) of from 5 to 40 μm and the aperture ratio of from 60 to 95%. The aperture ratio of the metal conductive layer means the proportion of the area of the opening portion of the layer to the projected area of the layer. The line pitch ($W_2$) of the metal conductive layer preferably is in the range of from 50 to 1000 μm, more preferably from 100 to 400 μm. The present invention brings about the pretreatment layer having microscopic pattern with high dimensional accuracy as described above.

As described in the above-mentioned pretreatment layer, the mesh-shaped metal conductive layer may be formed on the central portion of the transparent substrate and the metal conductive layer having a flame shape may be formed on the surrounding portion of the transparent substrate other than the central portion.

The thickness of the metal conductive layer preferably is in the range of from 1 to 200 μm, more preferably from 5 to 100 μm, in particularly from 2 to 10 μm. If the thickness of the metal conductive layer is too small, the electromagnetic wave shielding property may not be improved sufficiently. From a viewpoint of the miniaturization of the light transmissive electromagnetic wave shielding material, the too large thickness of the metal conductive layer is not preferred.

In the present invention, as shown by the FIG. 1, the metal conductive layer 13 can be subjected to a blackening treatment to form a blackening treatment layer 14 on at least part of the surface of the metal conductive layer 14 (an arrow A3 of FIG. 1).

The blackening treatment is carried out preferably by subjecting the metal conductive layer to an oxidation treatment or a sulfurization treatment. In particular, the sulfurization treatment is preferred, because it improves the anti-glare property, and ensures an improved waste liquid treatment and an improved environment safety.

In case the oxidation treatment is carried out as the blackening treatment, the blackening treatment liquid used in the oxidation treatment includes a mixed aqueous solution of a hypochlorite and a sodium hydroxide, a mixed aqueous solution of a chlorite and a sodium hydroxide and a mixed aqueous solution of a peroxodisulfuric acid and a sodium hydroxide. In particularly, from the viewpoint of economic efficiency, the mixed aqueous solution of the hypochlorite and the sodium hydroxide and the mixed aqueous solution of the chlorite and the sodium hydroxide are preferred.

In case the sulfurization treatment is carried out as the blackening treatment, the blackening treatment liquid includes an aqueous solution comprising, for example, a potassium sulfide, a barium sulfide and a ammonium sulfide, preferably the potassium sulfide and the ammonium sulfide. Particularly preferred is the ammonium sulfide which can be used at low temperature.

The thickness of the blackening treatment layer preferably is in the range of from 0.01 to 1 μm, more preferably from 0.01 to 0.5 μm. If the thickness is less than 0.01 μm, the anti-glare property may not be obtained sufficiently. If the thickness is more than 1 μm, the apparent aperture ratio when looking from an angle may be decreased.

In the present invention, the use of the pretreatment agent comprising no a powdery particle enables the formation of the pretreatment layer without formation of the crack and the fog, whereby the light transmissive electromagnetic wave shielding material having an excellent appearance property and an excellent visual property is obtained.

The light transmissive electromagnetic wave shielding material includes the transparent substrate, the mesh-shaped pretreatment layer formed on the transparent substrate and the mesh-shaped metal conductive layer formed on the pretreatment layer. The pretreatment layer is formed by using the pretreatment agent for electroless plating which comprises the noble metal compound and the mixture of silane coupling agent and azole compound or the reaction product thereof.

The pretreatment agent for electroless plating preferably comprises further a synthetic resin. This pretreatment agent can form the pretreatment layer having a high adhesion to the transparent substrate and the metal conductive layer. It is, therefore, possible to prevent the detachment of the pretreatment layer and form the metal conductive layer with a high dimensional accuracy.

The light transmissive electromagnetic wave shielding material may have a blackening treatment layer on at least part of the surface of the metal conductive layer in order to provide the metal conductive layer with anti-glare property.

Use of the pretreatment agent for electroless plating comprising the specific component ensures the high light transmissive property of the pretreatment layer and the transparent substrate to the light transmissive electromagnetic wave shielding material. Therefore, the total light transmittance of the plating protective layer preferably is not less than 75%, in particularly is in the range of 80 to 90%.

A total light transmittance of the light transmissive electromagnetic wave shielding material can be determined by measuring the total light transmittance in the direction of the thickness of the light transmissive electromagnetic wave shielding material by means of a full automatic Digital Haze Computer HGM-2DP manufactured by Suga Test Instrument Co., Ltd.

The explanations of each layers of the light transmissive electromagnetic wave shielding material are carried out as above, and therefore, omitted here.

The light transmissive electromagnetic wave shielding material of the present invention preferably can be used in applications requiring the light transmissive property, for example, display surface of display devices such as LCD, PDP and CRT generating the electromagnetic wave, a surface of transparent glass and transparent panel used in facility and building. The light transmissive electromagnetic wave shielding material having a high light transmissive property and a high electromagnetic wave shielding property is preferably used as a display filter for the display device.

The display filter can be obtained, for example by laminating the light transmissive electromagnetic wave shielding material on a transparent substrate such as glass substrate through an adhesive layer. In the display filter, the openings of the mesh-shaped pretreatment layer and the mesh-shaped metal conductive layer are filled with the adhesive layer.

The display filter may further have an anti reflective layer, a color adjusting layer or a near-infrared absorption layer in addition to the transparent substrate, the electromagnetic wave shielding layer and the adhesive layer. The laminating order of these layers can be determined depending on the application. In addition, the display filter may have an electrode which is used for conducting the display filter to a grounding electrode of the PDP.

EXAMPLE

The present invention is illustrated in detail below using the following Examples.

Example 1-1

1. Preparation of a Pretreatment Agent

γ-Glycidoxypropyltrimethoxysilane was added to imidazole at a mole ratio of 1:1, and reacted for an hour and for 100 minutes, to prepare a reaction product. Palladium chloride was added to a 5 wt % aqueous solution of the reaction product with stirring at 25° C. to prepare a solution having palladium chloride concentration of 10 g/L. This solution was diluted with n-butanol by 100-fold by volume to prepare a pretreatment agent having palladium chloride concentration of 100 mg/L.

2. Formation of a Mesh-Shaped Preparation Layer

The pretreatment agent was printed in a mesh pattern on a PET film (the thickness of 100 μm) by gravure printing, and then dried at 120° C. for 5 minutes to form a mesh-shaped pretreatment layer. The pretreatment layer had a line width of 20 μm, a line pitch of 235 μm, an aperture ratio of 85% and a thickness of 0.15 μm.

3. Formation of the Metal Conductive Layer

The PET film on which the pretreatment layer had been formed was immersed in an electroless plating copper solution (Melpate CU-5100 manufactured by Meltex Co., Ltd) and subjected to electroless plating treatment 50° C. for 20 minutes to form a mesh-shaped metal conductive layer. The metal conductive layer had a line width of 28 μm, a line pitch of 227 μm, an aperture ratio of 79% and a thickness of 4 μm.

4. Blackening Treatment of the Metal Conductive Layer

In addition, the PET film on which the metal conductive layer had been formed was subjected to a blackening treatment as follows.
Composition of Blackening Treatment Solution (Aqueous Solution):
 Sodium chlorite: 10 wt %
 Sodium hydroxide: 4 wt %

Condition of Blackening Treatment:
 bath temperature: about 60° C.
 time: 5 minutes A light transmissive electromagnetic wave shielding material having the metal conductive layer whose surface was subjected to the blackening treatment can be obtained. The average thickness of the blackening treatment layer formed on the surface of the light transmissive electromagnetic wave shielding material was 0.5 μm.

Example 1-2

The PET film on which the pretreatment layer had been formed by the same manner as the example 1-1 was immersed in an electroless plating copper solution (Melpate CU-5100 manufactured by Meltex Co., Ltd) and subjected to electroless plating treatment at 50° C. for 5 minutes to form a mesh-shaped metal conductive layer. Then the PET film was immersed in an aqueous solution of copper sulfate for electrolytic plating and applied electrical current (the current density of 2 A/dm$^2$) to it by a rectifier for 5 minutes to form a mesh-shaped metal conductive layer. The metal conductive layer had a line width of 28 μm, a line pitch of 227 μm, an aperature ratio of 79% and a thickness of 4 μm.

Then the metal conductive layer was subjected to a blackening treatment by the same manner as the example 1-1 to provide a light transmissive electromagnetic wave shielding material having the metal conductive layer whose surface was subjected to the blackening treatment.

Example 1-3

The PET film on which the pretreatment layer had been formed by the same manner as the example 1-1 was immersed in a nickel-boron alloy electroless plating solution (Top Chemialloy B-1 manufactured by OKU-NO CHEMICAL INDUSTRIES Co., Ltd) and subjected to electroless plating treatment to form a mesh-shaped metal conductive layer at 60° C. for 5 minutes. Then the PET film was immersed in an aqueous solution of copper sulfate for electrolytic plating and applied electrical current (the current density of 2 A/dm$^2$) to it by a rectifier for 5 minutes to form a mesh-shaped metal conductive layer. The metal conductive layer had a line width of 28 μm, a line pitch of 227 μm, an aperature ratio of 79% and a thickness of 4 μm.

Then the metal conductive layer was subjected to a blackening treatment by the same manner as the example 1-1 to provide a light transmissive electromagnetic wave shielding material having the metal conductive layer whose surface was subjected to the blackening treatment.

Example 2-1

1. Preparation of a Pretreatment Agent

γ-Glycidoxypropyltrimethoxysilane was added to imidazole at a mole ratio of 1:1, and reacted for an hour and for 100 minutes, to prepare a reaction product. Palladium chloride was added to a 5 wt % aqueous solution of the reaction product with stirring at 25° C. to prepare a solution having palladium chloride concentration of 10 g/L. This solution was diluted with n-butanol by 100-fold by volume to prepare a catalyst solution having palladium chloride concentration of 100 mg/L.

Then 30 parts by weight of the catalyst solution and 20 parts by weight of toluene were added to 100 parts by weight of a black ink (SS8911 from TOYO INK MFG. CO., LTD.)

comprising 25 parts by weight of a mixed resin of vinyl chloride and acrylic resin and 5 parts by weight of carbon black to prepare a pretreatment agent.

2. Formation of a Mesh-Shaped Pretreatment Layer

The pretreatment agent was printed in a mesh pattern on a PET film (the thickness of 100 µm) by gravure printing, and then dried at 120° C. for 5 minutes to form a mesh-shaped pretreatment layer. The pretreatment layer had a line width of 20 µm, a line pitch of 235 µm, a aperture ratio of 85% and a thickness of 0.5 µm.

3. Formation of the Metal Conductive Layer

The PET film on which the pretreatment layer had been formed was immersed in an electroless plating copper solution (Melpate CU-5100 manufactured by Meltex Co., Ltd) and subjected to electroless plating treatment at 50° C. for 5 minutes to form a mesh-shaped metal conductive layer. The metal conductive layer had a line width of 28 µm, a line pitch of 227 µm, an aperture ratio of 79% and a thickness of 4 µm.

4. Blackening Treatment of the Metal Conductive Layer

In addition, the glass plate on which the metal conductive layer had been formed was subjected to a blackening treatment as follows.
Composition of the Blackening Treatment Solution (Aqueous Solution):
 Sodium chlorite: 10 wt %
 Sodium hydroxide: 4 wt %
 Condition of the Blackening Treatment:
 bath temperature: about 60° C.
 time: 5 minutes A light transmissive electromagnetic wave shielding material having the metal conductive layer whose surface was subjected to the blackening treatment can be obtained. The thickness of the blackening treatment layer formed on the surface of the light transmissive electromagnetic wave shielding material was 0.5 µm on average.

Example 2-2

The PET film on which the pretreatment layer had been formed by the same manner as the example 2-1 was immersed in an electroless plating copper solution (Melpate CU-5100 manufactured by Meltex Co., Ltd) and subjected to electroless plating treatment at 50° C. for 5 minutes to form a mesh-shaped metal conductive layer. Then the PET film was immersed in an aqueous solution of copper sulfate for electrolytic plating and applied electrical current (the current density of 2 A/dm$^2$) to it by a rectifier for 5 minutes to form a mesh-shaped metal conductive layer. The metal conductive layer had a line width of 28 µm, a line pitch of 227 µm, an aperture ratio of 79% and a thickness of 4 µm.

Then the metal conductive layer was subjected to a blackening treatment by the same manner as the example 2-1 to provide a light transmissive electromagnetic wave shielding material having the metal conductive layer whose surface was subjected to the blackening treatment.

Example 2-3

The PET film on which the pretreatment layer had been formed by the same manner as the example 2-1 was immersed in a nickel-boron alloy electroless plating solution (Top Chemialloy B-1 manufactured by OKU-NO CHEMICAL INDUSTRIES Co., Ltd) and subjected to electroless plating treatment at 50° C. for 5 minutes to form a mesh-shaped metal conductive layer. Then the PET film was immersed in an aqueous solution of copper sulfate for electrolytic plating and applied electrical current (the current density of 2 A/dm$^2$) to it by a rectifier for 5 minutes to form a mesh-shaped metal conductive layer. The metal conductive layer had a line width of 28 µm, a line pitch of 227 µm, an aperature ratio of 79% and a thickness of 4 µm.

Then the metal conductive layer was subjected to a blackening treatment by the same manner as the example 2-1 to provide a light transmissive electromagnetic wave shielding material having the metal conductive layer whose surface was subjected to the blackening treatment.

[Evaluation]

In the above examples, the pretreatment agents were printed without formation of a crack and a fog. In addition, the pretreatment layers were not detached during the electroless plating. The light permeable electromagnetic wave shielding materials therefore obtained in the above examples had an excellent appearance property and an excellent yield rate.

In addition, the adhesion of the pretreatment layer to the transparent substrate and the metal conductive layer were evaluated by attaching a cellophane tape to the metal conductive layer and removing the cellophane tape. All layers of the light permeable electromagnetic wave shielding materials obtained in the above examples 2-1, 2-2 and 2-3 were not detached.

The invention claimed is:

1. A process for the preparation of a light transmissive electromagnetic wave shielding material comprising;
 printing a pretreatment agent for electroless plating comprising a noble metal compound and a mixture of a silane coupling agent and an azole compound or a reaction product thereof in a mesh pattern on a transparent substrate to form a mesh-patterned pretreatment layer, and
 subjecting the pretreatment layer to electroless plating to form a mesh-patterned metal conductive layer on the pretreatment layer.

2. A process as defined in claim 1, wherein the silane coupling agent is an epoxy group-containing silane compound.

3. A process as defined in claim 1, wherein the silane coupling agent is γ-glycidoxypropyltrialkoxysilane.

4. A process as defined in claim 1, wherein the azole compound is imidazole.

5. A process as defined in claim 1, wherein the noble metal compound is a compound containing at least one metal atom selected from the group consisting of palladium, silver, platinum and gold.

6. A process as defined in claim 1, wherein the pretreatment agent for electroless plating further comprises a synthetic resin.

7. A process as defined in claim 6, wherein the synthetic resin is at least one selected from the group consisting of acrylic resin, polyester resin, polyurethane resin, vinyl chloride resin and ethylene-vinyl acetate copolymer.

8. A process as defined in claim 6, wherein the synthetic resin has a functional group having an active hydrogen at a terminal position.

9. A process as defined in claim 8, wherein the functional group having the active hydrogen is at least one selected from the group consisting of a hydroxyl group, carbonyl group and amino group.

10. A process as defined in claim 1, wherein the pretreatment agent for electroless plating further comprises a fine particle.

11. A process as defined in claim 10, wherein the fine particle is at least one particle selected from the group consisting of silica particle, calcium carbonate particle, carbon particle, alumina particle, talc particle, mica particle, glass flake, metallic whisker, ceramic whisker, calcium sulfate whisker and smectite.

12. A process as defined in claim 1, wherein the pretreatment agent for electroless plating further comprises a thixotropic agent.

13. A process as defined in claim 1, wherein the pretreatment agent for electroless plating further comprises a black coloring agent.

14. A process as defined in claim 13, wherein the black coloring agent is at least one selected from the group consisting of carbon black, titan black, black iron oxide, black lead and activated carbon.

15. A process as defined in claim 1, wherein the pretreatment agent for electroless plating is printed in the mesh pattern on the transparent substrate and dried at a temperature of 80 to 160° C.

16. A process as defined in claim 1, wherein a metal used for the electroless plating is at least one selected from the group consisting of silver, copper and aluminum.

17. A process as defined in claim 1, wherein the pretreatment layer is further subjected to electrolytic plating after the electroless plating.

18. A process as defined in claim 1, which further comprising;
    subjecting the metal conductive layer to a blackening treatment to form a blackening treatment layer on at least a part of a surface of the metal conductive layer.

19. A process as defined in claim 18, wherein the blackening treatment is carried out by subjecting the metal conductive layer to an oxidation treatment or an sulfurization treatment.

20. A light transmissive electromagnetic wave shielding material prepared by the process described in claim 1.

21. A light transmissive electromagnetic wave shielding material comprising a transparent substrate, a mesh-patterned pretreatment layer formed on the transparent substrate and a mesh-patterned metal conductive layer formed on the pretreatment layer,
    wherein the pretreatment layer is formed by using a pretreatment agent for electroless plating comprising a noble metal compound and a mixture of silane coupling agent and azole compound or a reaction product thereof.

22. A light transmissive electromagnetic wave shielding material as defined in claim 21, wherein the pretreatment agent for electroless plating further comprises a synthetic resin.

23. A light transmissive electromagnetic wave shielding material as defined in claim 21, wherein a blackening treatment layer is formed on at least a part of a surface of the metal conductive layer.

24. A display filter comprising the light transmissive electromagnetic wave shielding material described in claim 21.

25. A light transmissive electromagnetic wave shielding material as defined in claim 21, wherein the silane coupling agent is γ-glycidoxypropyltrialkoxysilane.

26. A light transmissive electromagnetic wave shielding material as defined in claim 21, wherein the azole compound is imidazole.

* * * * *